（12）United States Patent
Yoshii et al.

(10) Patent No.: US 7,419,529 B2
(45) Date of Patent: Sep. 2, 2008

(54) METHOD OF FORMING FINE PARTICLE ARRAY ON SUBSTRATE AND SEMICONDUCTOR ELEMENT

(75) Inventors: Shigeo Yoshii, Hirakata (JP); Michihito Ueda, Kyoto (JP); Nozomu Matsukawa, Nara (JP); Ichiro Yamashita, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 415 days.

(21) Appl. No.: 11/284,910

(22) Filed: Nov. 23, 2005

(65) Prior Publication Data

US 2006/0070494 A1    Apr. 6, 2006

Related U.S. Application Data

(63) Continuation of application No. PCT/JP2005/009629, filed on May 26, 2005.

(30) Foreign Application Priority Data

May 27, 2004 (JP) .............................. 2004-157773

(51) Int. Cl.
B22F 9/20 (2006.01)
(52) U.S. Cl. .................... 75/362; 75/369; 423/592.1
(58) Field of Classification Search ............. 75/362, 75/369
See application file for complete search history.

(56) References Cited

U.S. PATENT DOCUMENTS

| 5,328,681 A | * | 7/1994 | Kito et al. ................. 424/9.322 |
| 6,121,075 A | | 9/2000 | Yamashita |
| 6,303,516 B1 | | 10/2001 | Morita et al. |
| 7,015,139 B2 | * | 3/2006 | Yamashita ................... 438/674 |
| 2004/0028694 A1 | * | 2/2004 | Young et al. ............. 424/190.1 |

FOREIGN PATENT DOCUMENTS

| JP | 2002-223016 | 8/2002 |
| JP | 2005-118963 | 5/2005 |

* cited by examiner

Primary Examiner—George Wyszomierski
(74) Attorney, Agent, or Firm—McDermott Will & Emery LLP

(57) ABSTRACT

An object of the present invention is to provide a method of forming fine particles on a substrate in which reoxidization of reduced fine particles is suppressed. Reduced fine particles (FeO fine particles) are formed by embedding metal oxide fine particles ($Fe_2O_3$ fine particles) fixed on a p type silicon semiconductor substrate into a silicon oxidized film, and carrying out a heat treatment in a reducing gas atmosphere. Presence of the silicon oxidized film enables suppression of reoxidization of the reduced fine particles (FeO fine particles) due to exposure to the ambient air.

3 Claims, 16 Drawing Sheets

METHOD OF FORMING FINE PARTICLE ARRAY ON SUBSTRATE AND SEMICONDUCTOR ELEMENT

This Application is a continuation of International Application No. PCT/JP2005/009629, whose international filing date is May 26, 2005, which in turn claims the benefit of Japanese Patent Application No. 2004-157773, filed on May 27, 2004, the disclosures of which Applications are incorporated by reference herein. The benefit of the filing and priority dates of the International and Japanese Applications is respectfully requested.

BACKGROUND OF THE INVENTION

1. Field of the Invention

The present invention relates a method of forming a fine particle array on a substrate utilizing a hollow protein. Further, the present invention relates to a semiconductor element utilizing the fine particle array.

2. Description of the Related Art

There were conventional methods of forming fine particles which comprise fixing a protein complex, which can include a fine particle therein, on a substrate; removing the protein by a heat treatment or the like; and reducing in a reducing atmosphere to produce a metal atom aggregate (for example, see, Japanese Patent Provisional Publications No. 2002-223016, No. H11-45990 and No. H11-233752).

FIG. 2 shows a conventional method of forming fine particles described in Japanese Patent Provisional Publications No. 2002-223016 and No. H11-233752; FIG. 3 shows a conventional method of forming fine particles described in Japanese Patent Provisional Publication No. H11-45990; and FIG. 4 shows a conventional method of forming fine particles described in Japanese Patent Provisional Publication No. H11-233752, respectively.

In FIG. 2A and FIG. 3A, protein complexes (ferritin) 4 including a fine particle therein are dispersed in an aqueous solution in a water bath 3. Next, when a polypeptide film (PBLH) 5 is formed on the surface of water, the aforementioned protein complexes 4 are adsorbed onto the polypeptide film 5 to form a high density monolayer film on surface of the aqueous solution (FIG. 2B and FIG. 3B). Next, by bringing a substrate 6 into contact with this surface of water, the monolayer film of the protein complexes 4 is transferred to the substrate 6 (FIG. 2C and FIG. 3C), thereby allowing high density fine particles to be fixed on the substrate (FIG. 2D and FIG. 3D).

In Japanese Patent Provisional Publications No. 2002-223016 and No. H11-233752, protein components are thereafter eliminated by subjecting the substrate to a heat treatment in an inert gas (nitrogen) atmosphere. In Japanese Patent Provisional Publication No. H11-45990, the protein components are eliminated by subjecting the substrate 6 to an ozone treatment at 100° C. to 150° C. as shown in FIG. 3E to form iron oxide fine particles 8 on the substrate (FIG. 3F).

Although not shown in the Figure, in Japanese Patent Provisional Publications No. 2002-223016, No. H11-45990 and No. H11-233752, reduction is thereafter executed by subjecting to a heat treatment in hydrogen at 300 to 500° C. to form iron atom aggregates (metal fine particles).

In the method of manufacturing a semiconductor element disclosed in Japanese Patent Provisional Publication No. H11-233752, metal oxide fine particles, and protein complexes 204 comprising a hollow protein including a metal oxide fine particle therein (hereinafter, referred to as "protein complex") are first arranged on a gate oxidized film 203, as shown in FIG. 4A. Next, the hollow protein is removed, and then the metal oxide fine particles are subjected to a reduction treatment. Thereafter, as shown in FIG. 4B, a silicon oxidized film is further formed with a CVD method, and a semiconductor element having metal fine particles is formed by embedding the reduced metal fine particles into the silicon oxidized film.

SUMMARY OF THE INVENTION

However, the constitution according to the aforementioned conventional techniques involved problems of reoxidation of the metal atom aggregate produced by the reduction treatment due to exposure to the atmospheric air, or in the initial stage of laminating an insulating layer in the following step. Hence, majority of the embedded fine particles return back to the original metal oxide to result in difficulties in fulfilling a desired function.

The present invention solves the problems in the aforementioned conventional techniques. Thus, an object of the present invention is to provide a method of forming fine particles in which reoxidation of reduced fine particles is suppressed.

A method of forming a fine particle array on a substrate according to the present invention provided in order to solve the aforementioned problem in the prior art comprises:

a step A of fixing metal oxide fine particles and protein complexes comprising a hollow protein, which includes the aforementioned metal oxide fine particle therein, on said substrate, a step B of removing the hollow protein while leaving the metal oxide fine particles on the substrate after the aforementioned step A, a step C of laminating an insulating layer having a film thickness of 3 nm or greater and 100 nm or less, which is hardly reduced compared to the metal oxide fine particles, on the substrate on which the metal oxide fine particles were disposed, and a step D of reducing the metal oxide fine particles by subjecting the substrate, on which the insulating layer was laminated in the step C, to a heat treatment in a reducing atmosphere.

The "insulating layer which is hardly reduced compared to the metal oxide fine particles" herein means an "insulating layer constituted from an oxide of a second single element (metal or semiconductor) having a lower standard free energy of formation compared to the metal oxide fine particles upon formation through binding of the single element with one molecule of oxygen (1 mol), or an insulating layer constituted from a nitride or an oxynitride of the single element constituting the second oxide".

Furthermore, the semiconductor element according to the present invention is formed by a method of arranging fine particles on a substrate which comprises:

a step E of forming a first insulating layer on a semiconductor substrate, a step A of fixing metal oxide fine particles and protein complexes comprising a hollow protein, which includes the aforementioned metal oxide fine particle therein, on the substrate, a step B of removing the hollow protein while leaving the metal oxide fine particles on the substrate after the aforementioned step A, a step C of laminating a second insulating layer of a metal of having a lower standard free energy of formation than that of the metal constituting the metal oxide fine particles, on the substrate on which the metal oxide fine particles were disposed, and a step D of reducing the metal oxide fine particles by subjecting the substrate, on which the second insulating layer was laminated in the step C, to a heat treatment in a reducing atmosphere.

In the method of arranging fine particles on a substrate, inorganic metal oxide fine particles are arranged on a substrate in the oxidized state which is stable having a high melting point and a high oxidation number; an insulating layer is produced thereon; and thereafter, reduction is executed into the metal or the oxide having a lower oxidation number (semiconductor or the like). Accordingly, an effect of preventing deterioration, movement and aggregation of the cores may be exerted, contrary to the conventional techniques which produce an insulating layer on metal cores or semiconductor cores having a low melting point and being unstable.

Also, in the method of arranging fine particles on a substrate according to the present invention, the inorganic metal oxide is reduced following the production of the insulating layer, therefore, an effect of decreasing damage (defect) in reduction, which was generated on the inorganic metal oxide fine particles (core) in formation of the insulating layer may be also exerted.

The aforementioned object, other object, features and advantages of the present invention will be apparent from the following detailed description of suitable embodiments with reference to the accompanying drawings.

According to the method of forming a fine particle array of the present invention, suppression of reoxidization of reduced fine particles is enabled.

BRIEF DESCRIPTION OF THE DRAWINGS

FIG. 8A shows results of the measurement of the substrate before the reduction treatment, while FIG. 8B shows those after the reduction treatment.

FIG. 10A shows results of the measurement of the element having no core formed, while FIG. 10B shows those of the element having cores formed.

FIG. 11A shows results of the measurement of the substrate subjected to a heat treatment at a temperature of 500° C., while FIG. 11B shows results of the measurement of the substrate subjected to a heat treatment at a temperature of 400° C.

DETAILED DESCRIPTION OF THE INVENTION

Figure 1A:
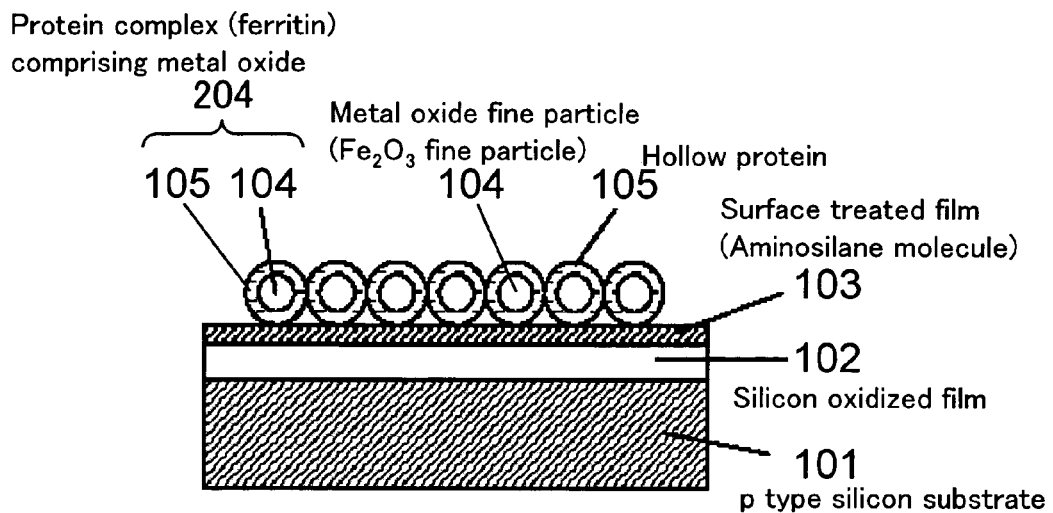
FIG. 1A to FIG. 1D are drawings illustrating a method of forming fine particle array on a substrate according to Embodiment 1 of the present invention.

Hereinafter, preferred embodiments of the present invention will be explained with reference to drawings.

Embodiment 1

A method of forming a fine particle array on a substrate according to Embodiment 1 of the present invention comprises, as shown in FIG. 1A to FIG. 1D, a step A of fixing metal oxide fine particles 104 and protein complexes (protein complex) 204 comprising a hollow protein 105, which includes the metal oxide fine particle 104 therein, on a substrate 101, a step B of removing the hollow protein 105 while leaving the metal oxide fine particles 104 on the substrate 101, a step C of laminating an insulating layer 106 to give a film thickness of 3 nm or greater and 100 nm or less, which is hardly reduced compared to the metal oxide fine particles 104, on the substrate 101 on which the metal oxide fine particles 104 were disposed, and a step D of reducing the metal oxide fine particles 104 by subjecting the substrate 101, on which the insulating layer 106 was laminated in the step C, to a heat treatment in a reducing atmosphere to yield reduced fine particles 107.

According to the present invention, the metal oxide fine particles 104 are reduced after forming the insulating layer 106, therefore, reoxidation of the reduced fine particles 107 can be suppressed.

As the substrate 101 according to the present invention, any type of substrate comprising a semiconductor, an insulator and a metal may be used depending on the application. In particular, use of a semiconductor substrate enables utilization in manufacture of a semiconductor element provided with fine particles having a uniform particle size distribution.

Also, constitution of the semiconductor substrate with Si is advantageous in that an SiO$_2$ film having a high quality to be a base for readily forming fine particles on the semiconductor substrate can be formed, and thus, more highly miniaturized semiconductor process techniques can be utilized.

Examples of the hollow protein 105 which may be used in the present invention include, e.g., hollow proteins having a spherical shell structure, and further, hollow protein complexes having a hollow structure in tubular or barrel-like shape. Specific examples which can be utilized include various types of ferritins and apoferritins (product obtained by removing iron hydroxide that is a core from ferritin), Listeria ferritin into which a heterologous core was introduced, Dps proteins, outer shell protein complexes of various spherical viruses such as CCMV, outer shell protein complexes of various tubular viruses such as TMV.

The metal oxide fine particle 104 according to the present invention means fine particles constituted from an oxide and hydroxide, an oxide hydrate of any kind of various metals. Specifically, any oxide and hydroxide or oxide hydrate of any kind of various metals such as iron oxide hydrate included in ferritin present in nature as well as copper, nickel or the like may be utilized as long as it can be included in the hollow protein 105.

As shown in FIG. 1A, it is also efficacious to form a surface treated film on a substrate 101 before the step A of fixing the protein complex 204 on the substrate 101. As the material of the surface treated film, a silane compound can be used. Use of the surface treated film enables introduction of each kind of functional group while keeping the surface state of the semiconductor substrate to be uniform and flat, and dispersion of the fine particles can be regulated. Specifically, the silane compound molecule being a molecule that has an alkoxyl silyl group $((R-O-)_nR_{3-n}Si-)$, a fluorosilyl group $(F_nR_{3-n}Si-)$, a chlorosilyl group $(Cl_nR_{3-n}Si-)$ $(1 \leq n \leq 3)$, or a bromosilyl group $(Br_nR_{3-n}Si-)$, (wherein $1 \leq n \leq 3$; R represents an alkyl group, a phenyl group, or a hydrogen) is preferred because it can rigidly bound to the substrate surface.

Moreover, formation of the $SiO_2$ film on the surface of the semiconductor substrate is advantageous in that the surface treatment with a silane compound or the like and subsequent formation of fine particles may be facilitated. The surface of $SiO_2$ can be readily modified with the silane compound because it is covered by a hydroxyl (—OH) group in the presence of water.

Hereinafter, details of one example of a fine particle array in which a silicon substrate is used will be illustrated as Embodiment 1 of the present invention.

As a preliminary step of the step A, as shown in FIG. 1A, a p type silicon semiconductor substrate 101 is oxidized at 800° C. to produce a substrate having a silicon thermally-oxidized film 102 having a film thickness of 5 nm formed on its surface.

Next, after washing the substrate with water, the silicon oxidized film surface is allowed to react with silane compound molecules to form a surface treated film 103. In this procedure, modification of the surface with an amino group was carried out using 3-(2-aminoethyl amino) propyl-trimethoxy silane (APTMS) that is a methoxysilane compound having an amino group, as the silane compound molecule, by immersing the substrate in the 5% aqueous solution for 5 min. After immersing in an aqueous silane compound solution, the substrate was immediately washed with running water for 10 min in purified water to remove excess silane compound. In addition, in order to strengthen the binding between the silane compound molecule and the $SiO_2$ surface, baking at 110° C. for 180 sec was conducted.

Next, as the step A, the substrate after subjecting to a surface treatment was immersed in an aqueous solution including ferritin (including iron oxide hydrate as a core), as the protein complex 204, dispersed therein for 60 min. After completing the immersion, the substrate was washed again with running water for 10 min in purified water to remove impurities followed by baking at 110° C., for 180 sec.

According to the foregoing operation, the protein complex (ferritin) 204 including a metal oxide fine particle 104 therein could be dispersed and fixed on the semiconductor substrate surface.

Figure 1B:
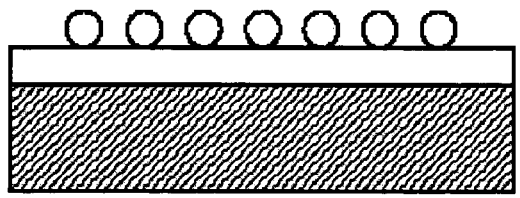

Next, in the step B, as shown in FIG. 1B, a substrate having metal oxide fine particles (iron oxide $Fe_2O_3$ fine particles) 104 with uniform particle size fixed thereon could be obtained by subjecting the substrate 101 having the protein complex (ferritin) 204 fixed thereon to a heat treatment in a nitrogen atmosphere at 400° C. thereby removing the hollow protein 105 around the protein complex (ferritin) 204 and the APTMS molecules on the substrate. State of dispersion of thus produced metal oxide fine particles 104 in the surface was uniform without contact among the fine particle cores. Accordingly, favorable state of dispersion could be yielded.

As described later, when the hollow protein 105 around the protein complex (ferritin) 204 and the APTMS molecules are removed by the heat treatment, it is preferred that the temperature is kept at 300° C. or higher and 450° C. or lower in an oxygen atmosphere, and is kept at 300° C. or higher and 600° C. or lower in a nitrogen atmosphere.

Figure 5:
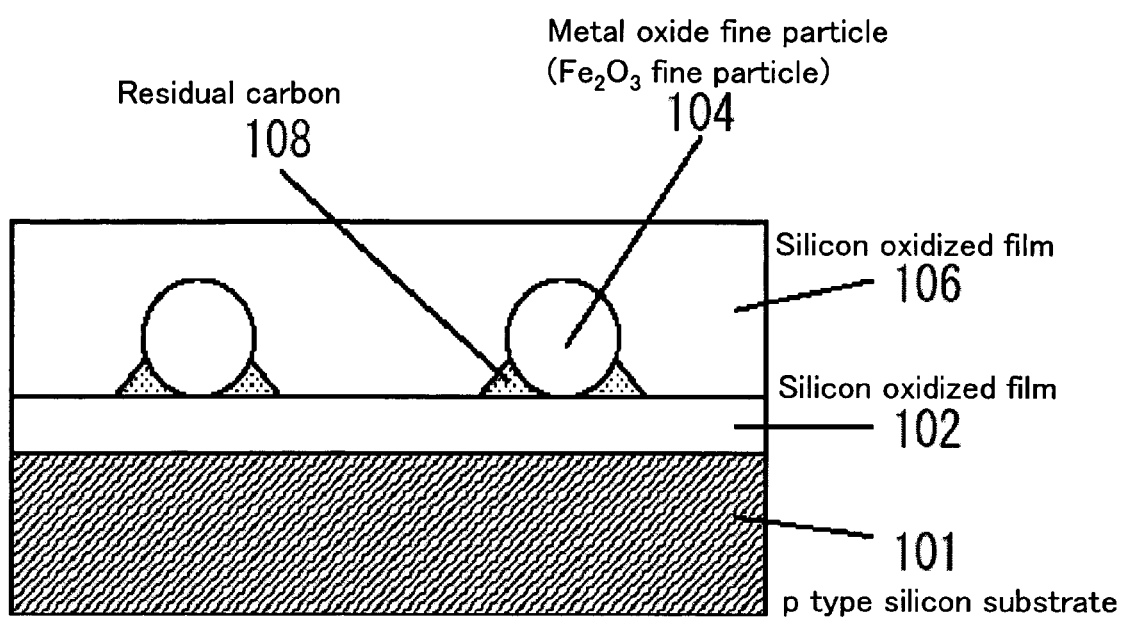
FIG. 5 is a cross sectional view illustrating a structure of a substrate prior to a reduction treatment according to Embodiment 1.

In this step, presence of carbon atoms around the metal oxide fine particle prior to the reduction treatment is desired in terms of perfecting the reduction of the metal oxide described later, as shown in FIG. 5. In the example shown in FIG. 5, residual carbon 108 is present around the $Fe_2O_3$ fine particles 104. Reducing force of carbon is increased as the temperature is elevated, therefore, an effect to deprive oxygen from the fine particles, and allow it to diffuse and release in the form of carbon monoxide may be exerted. Hence, the presence of the carbon atoms around the metal oxide fine particle promotes reduction of the fine particles within the insulating layer.

The hollow protein 105 around the protein complex (ferritin) 204 can be also removed by an oxidation treatment to permit exposure to oxygen plasma at room temperature, and the like.

Figure 1C:
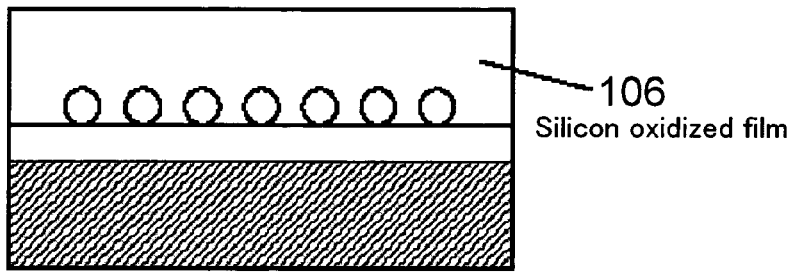
Figure 1D:
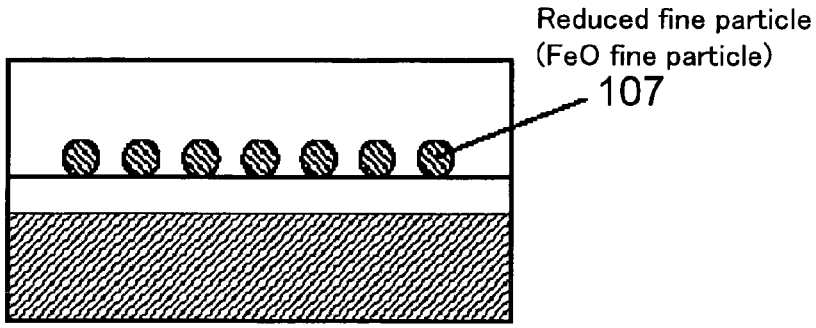
Figure 2A:
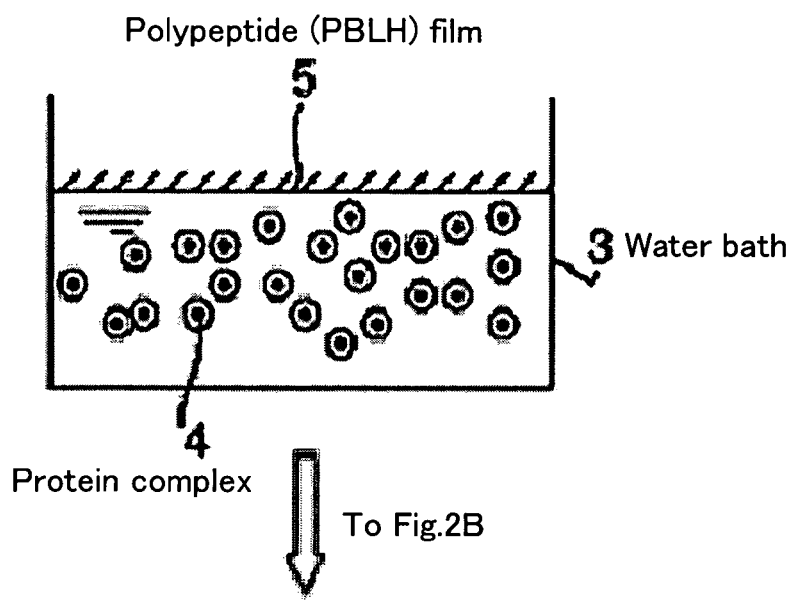
FIG. 2A to FIG. 2D are drawings illustrating one example of a conventional method of forming fine particles.
Figure 2B:
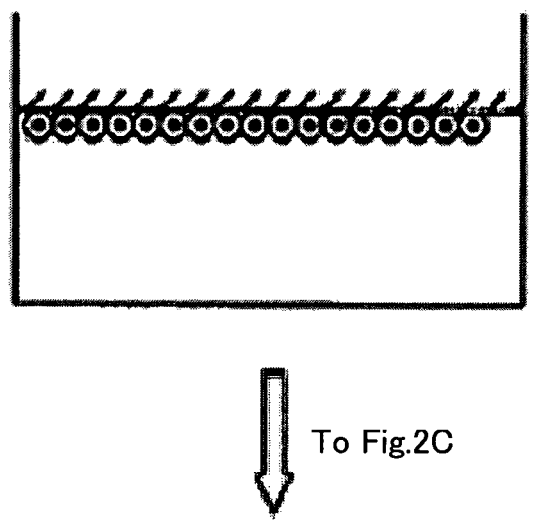
Figure 2C:
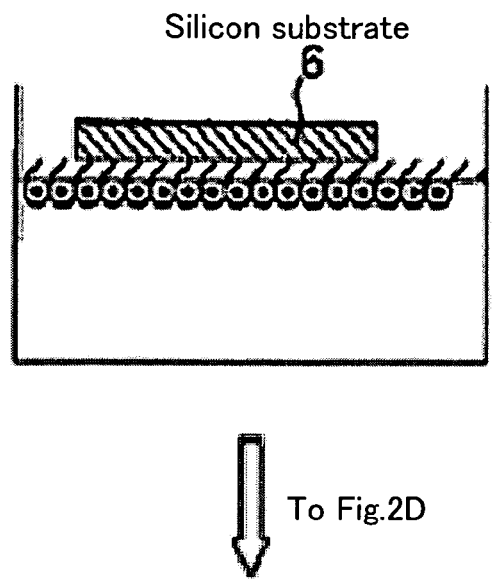
Figure 2D:
Figure 3A:
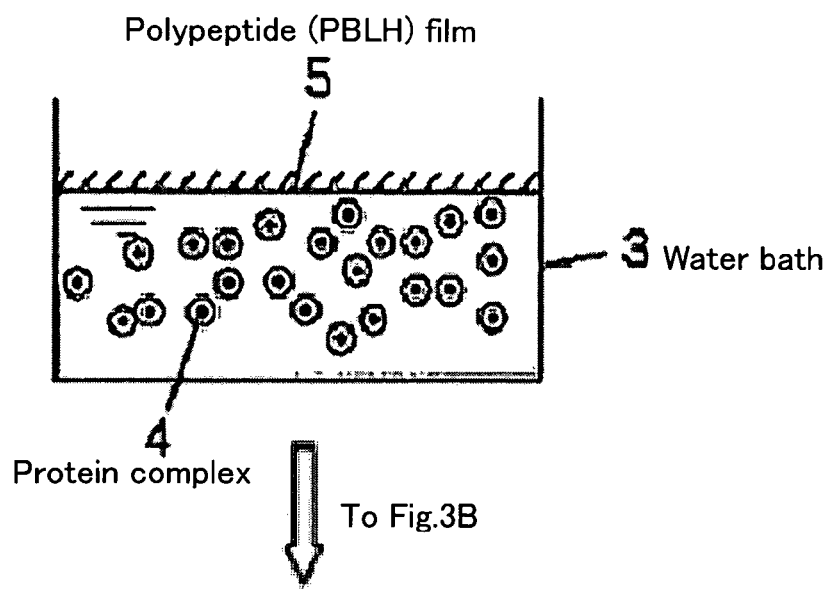
FIG. 3A to FIG. 3F are drawings illustrating another example of a conventional method of forming fine particles.
Figure 3B:
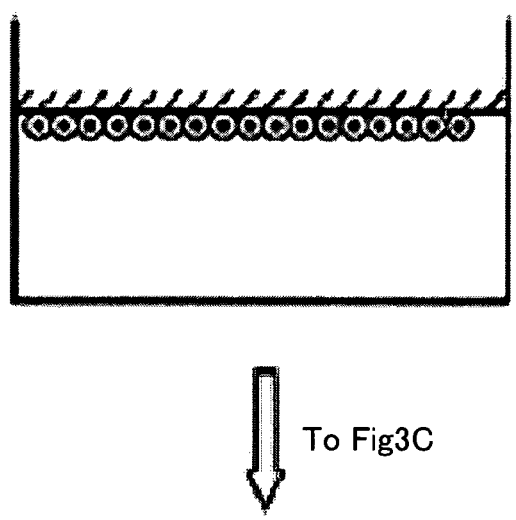
Figure 3C:
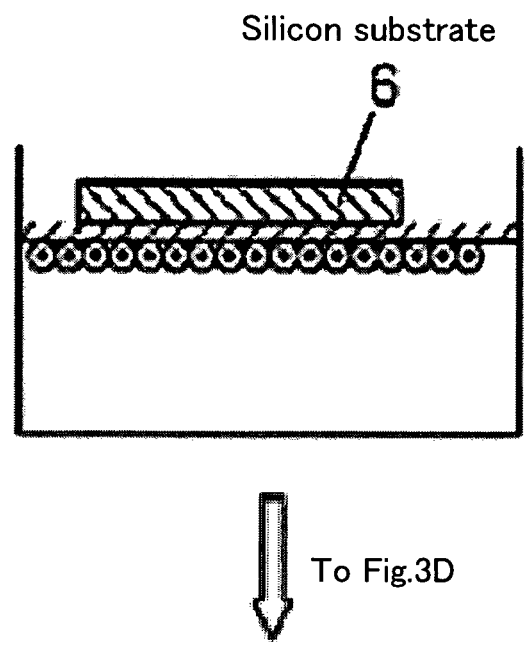
Figure 3D:
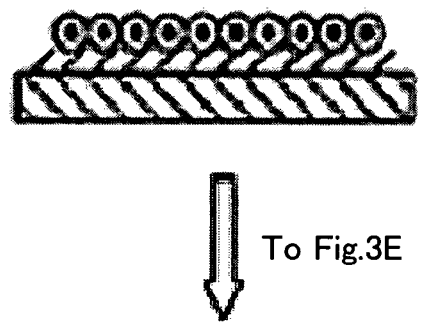
Figure 3E:
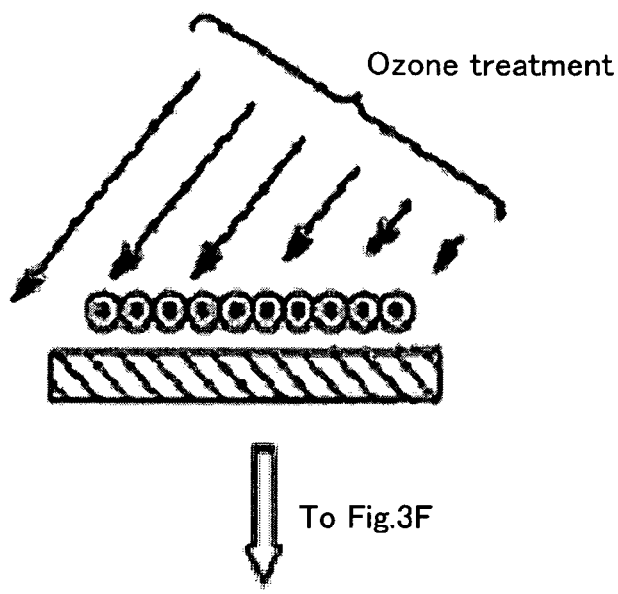
Figure 3F:
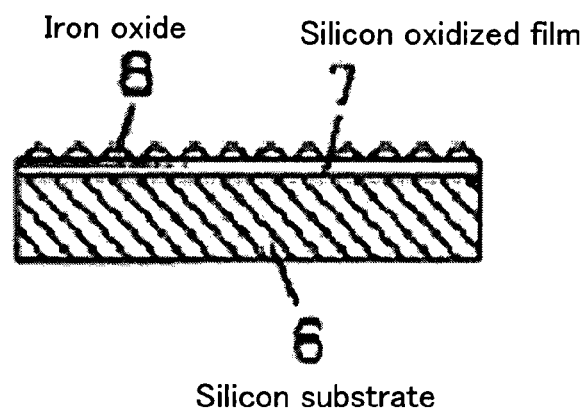
Figure 4A:
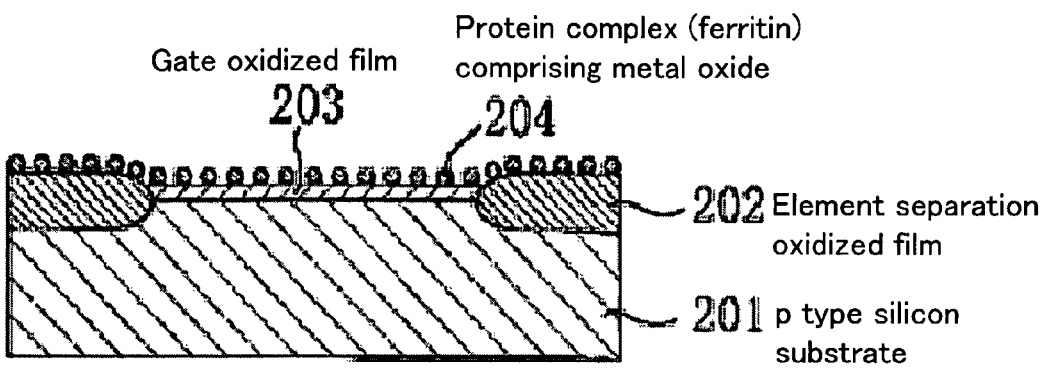
FIG. 4A and FIG. 4B are drawings illustrating a conventional method of manufacturing a semiconductor element.
Figure 4B:
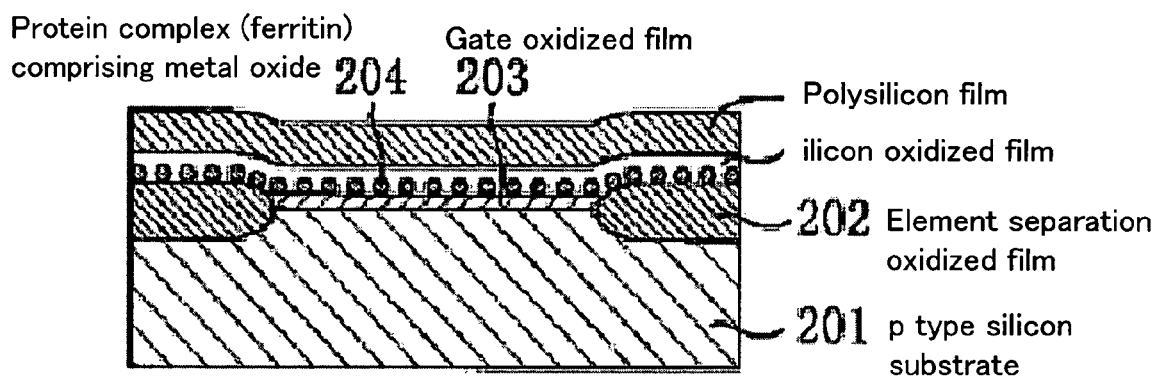

Next, in the step C, as shown in FIG. 1C, $SiO_2$ was laminated by a CVD method as an insulator on the substrate, which has the metal oxide fine particles ($Fe_2O_3$ fine particles) 104 formed thereon, to form a silicon oxidized film 106 having a film thickness of 50 nm thereby permitting embedment of the fine particles.

Finally, in the step D, as shown in FIG. 1 D, a reduction treatment of the fine particles was executed by carrying out a heat treatment in a reducing atmosphere. Specifically, the heat treatment is carried out in a hydrogen gas atmosphere or in an atmosphere of an inert gas (nitrogen, argon or the like) containing 5% or more hydrogen at a temperature of between 300° C. and 800° C. Hence, the metal oxide fine particles ($Fe_2O_3$ fine particles) 104 within the silicon oxidized film 106 are reduced to give reduced fine particles (FeO fine particle) 107.

Through the use of the method of this Embodiment, only the metal element (iron) constituting the fine particles embedded in the insulator can be selectively subjected to the reduction treatment without damaging or deteriorating the insulator and the substrate surface, by utilizing thermodynamic selectivity. After the reduction treatment, reoxidation upon recovery can be prevented by recovering into the ambient air after lowering the temperature to 200° C. or lower.

Although $Fe_2O_3$ serves as an insulator, FeO has a small band gap and a semiconductor performance, and thus can function as a charge retaining carrier or a quantum box enclosed within a silicon oxidized film insulator. In this Embodiment, $Fe_3O_4$ or a metal Fe can be also formed instead of FeO, depending on the reduction conditions. $Fe_3O_4$ can function as a semiconductor fine particle similarly to FeO, while Fe functions as a metal fine particle. Also, both $Fe_3O_4$ and Fe are ferromagnetic materials, therefore, they can also function as a magnetic fine particle.

Because these metal oxide fine particles or metal fine particles in their reduced state are surrounded by the insulating layer, they are stable also in an ambient air without being reoxidized as in conventional techniques. In particular, semiconductor fine particles of metal oxide (in case of iron, FeO and $Fe_3O_4$) in the embedded and reduced state exhibit high stability. Therefore, reoxidation is not caused even though it is entered into the following step of the semiconductor process (film laminating, etching, various washing, ashing steps and the like). Accordingly, it is advantageous in terms of facile processability into semiconductor elements and the like using a miniaturization technique.

As described in the foregoings, the constitution according to this Embodiment can provide a method of forming fine particles with suppressed reoxidation of the reduced fine particles.

In this Embodiment, $Fe_2O_3$ is used as a metal oxide, however, any oxide and hydroxide of other metal can be utilized as long as it can be included in a protein complex, such as e.g., nickel oxide, copper oxide or the like.

In addition, although silicon oxide is used as an insulator according to this Embodiment, other insulator can be utilized such as aluminum oxide or the like.

Next, a method of producing an insulating layer, film thickness of the insulating layer, reducing atmosphere, and preferred range of temperature of the treatment of reduction/heating and treatment time in the method of forming a fine particle array of this Embodiment will be sequentially explained in detail.

[Method of Forming Insulating Layer]

First, as a method of producing the insulating layer into which the metal oxide fine particles (core) are embedded, for example, a CVD method, a plasma CVD method, a sputtering method, a vapor deposition method or the like can be utilized. Temperature of the substrate in producing the insulating layer may be preferably 800° C. or lower. Hence, movement of a part of the cores within the insulating layer can be suppressed, thereby preventing the core size from being uneven, or inhibiting aggregation.

Furthermore, it is more preferred that the substrate temperature is 600° C. or lower. Accordingly, the core fine particles are fixed to prevent them from counter diffusion. Thus, interface between the core and the insulator can be kept sharp. When the film quality of the insulating layer is inferior, gas barrier property following reduction may be deteriorated, leading to possibility of reoxidization of the core. Therefore, when an embedded insulating layer is produced, a method capable of providing a favorable film quality even at a comparatively low temperature with less damage to the core oxide, for example, a plasma CVD method or the like may be preferably used.

[Film Thickness of Insulating Layer]

Next, it is desired that the insulating layer into which the metal oxide fine particles are embedded has a film thickness of 3 nm or greater and 100 nm or less. When the film thickness is equal to or greater than 3 nm, reoxidization of the embedded cores in their reduced state due to invasion of the oxygen molecules can be prevented through blocking the oxygen in the ambient air under the condition at room temperature. Although the core in Listeria ferritin collected from bacteria has a diameter of about 4.5 nm, the shape thereof turns into flattened to some extent when it is adsorbed to the substrate. Additionally, the size is reduced to some extent through losing water molecules upon conversion from ferrihydrite into $Fe_2O_3$. Therefore, cores of Listeria ferritin or recombinant Listeria ferritin based on the same can be covered by an insulating layer having a film thickness of 3 nm.

However, cores of equine spleen ferritin and recombinant ferritin based on the same such as Fer4 have a diameter of about 6 nm, therefore, it is difficult to completely cover them with a film thickness of 3 nm. Thus, when such ferritin cores are used, the insulating layer desirably has a film thickness of 5 nm or greater.

On the other hand, the insulating layer having a film thickness of 100 nm or less is preferred because entry of hydrogen in the atmosphere, and diffusion and release of produced water molecules in the reduction treatment, or diffusion of the oxygen atom in the insulating layer may be accelerated so that the reduction of the core is facilitated. Additionally, the film thickness of 50 nm or less is more preferred because still rapid reduction is enabled, and at the same time, application to semiconductor elements having a fine structure may be facilitated.

When the insulating layer into which the core fine particles (metal oxide fine particles) are embedded is a nitrided film (for example, silicon nitrided film), the gas barrier performance is higher compared to common oxidized films (for example, silicon oxidized films and the like). Therefore, the film thickness is preferably 50 nm or less. Furthermore, the film thickness of 25 nm or less is more preferred because further quicker reduction is enabled.

[Reducing Atmosphere]

Next, with respect to a reducing atmosphere in which the reduction treatment is carried out, for example, a hydrogen gas atmosphere or an inert gas (nitrogen, argon or the like) atmosphere containing 5% or more hydrogen gas can be utilized.

In addition thereto, an inert gas, e.g., nitrogen gas, argon gas, xenon gas or the like without including a hydrogen gas, or vacuum atmosphere can be also utilized although the reducing ability may be deteriorated. In this case, the heat treatment for a longer time period may be required at the same temperature of the treatment because of deteriorated reducing ability, however, it may be advantageous in that the process cost may be decreased and safety can be elevated because no flammable gas is involved.

[Reduction Treatment Temperature/Treatment Time]

Next, with respect to the temperature of the reduction treatment in the step D, the temperature of 300° C. or higher is preferred. This results in molecular diffusion (elimination of water molecules or diffusion of oxygen atoms) within the insulating layer, thereby enabling the reduction reaction of the core. Moreover, the temperature of the reduction treatment is preferably 400° C. or higher. This is preferred because the diffusion is further accelerated to facilitate the reaction.

On the other hand, the temperature of the reduction treatment is preferably 800° C. or lower. Accordingly, movement of a part of the cores within the insulating layer can be suppressed, thereby preventing the core size from being uneven, or inhibiting aggregation. Furthermore, the temperature of the reduction treatment is more preferably 600° C. or lower. Hence, the core fine particles are fixed to prevent them from counter diffusion, thereby enabling the interface between the core and the insulator to be kept sharp.

Time period of the reduction treatment is preferably 10 min or longer, and 2 hours or shorter. When the treatment time is 10 min or longer, reduction through the insulating layer may be enabled. To the contrary, when the treatment time is 2 hours or less, excessive diffusion and movement of the core fine particles, as well as deterioration of the shape and state of dispersion can be inhibited.

Embodiment 2

In this Embodiment 2, one example of the method of forming a fine particle array in which a silicon nitride is used as an insulator will be illustrated.

Figure 6:
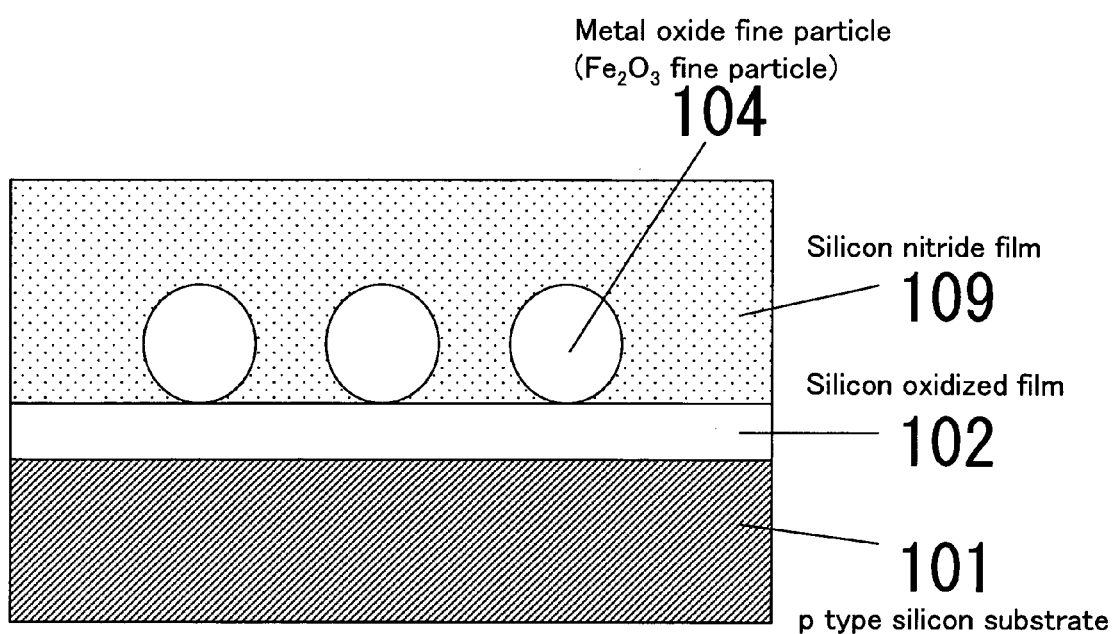
FIG. 6 is a cross sectional view illustrating a structure of a substrate according to Embodiment 2.

In FIG. 6, cross sectional structure of the substrate produced in this Embodiment is shown. First, a p type silicon substrate 101 is washed to remove naturally oxidized film. Thereafter, a silicon thermally-oxidized film 102 having a film thickness of 3 nm was formed on the surface at 800° C. with a rapid thermal oxidation (RTO) method.

Next, thus produced substrate was subjected to a UV ozone treatment, and the contaminants (organic compounds and the like) adsorbed on the surface were removed to obtain a clean surface. In the UV ozone treatment, the substrate is exposed into an atmosphere of a mixture of ozone and oxygen under an ultraviolet irradiating condition to oxidize and remove the organic compound molecules. In this Embodiment, the treatment was conducted at 110° C. for 10 min. Because the substrate surface is clean immediately after the production of the silicon oxidized film 102 through thermally oxidizing the substrate, this UV ozone treatment may be omitted.

Next, onto thus treated substrate was added an aqueous ferritin solution dropwise to permit adsorption of the ferritin (protein complex adsorption) on the substrate surface. In this step, an aminosilane treatment of the substrate surface was not carried out, but direct adsorption of the protein complex using a pH-adjusted aqueous solution was carried out. As the hollow protein having a basket-like shape included in the protein complex, recombinant ferritin (Fer4) was used which had been artificially produced by incorporating a gene modified on the basis of equine spleen ferritin into *Escherichia coli*. Although there are two types of monomers of L type and H type constituting naturally occurring equine spleen ferritin, amino acid sequence of Fer4 corresponds to the amino acid sequence of L type ferritin monomer with deletion of 4 residues from its N-terminus.

The aforementioned Fer4 including a core of iron oxide hydroxide (ferrihydrite: $5Fe_2O_3.9H_2O$) as a metal oxide fine particle formed inside was subjected to substitution with pure water to produce a ferritin solution (protein complex solution) having a concentration of 0.5 mg/mL, and thereto was further added a mixed buffer of MES and TRIS to adjust the pH of 5.8. This ferritin solution was added onto the aforementioned silicon substrate dropwise, and left to stand still at room temperature for 30 min. Thereafter, the substrate was washed in pure water to remove excess ferritin solution. Accordingly, a high-density monolayer adsorption film of ferritin was formed on the substrate.

Moreover, this substrate was subjected to the UV ozone treatment to selectively remove only the hollow protein part while leaving the core oxide (metal oxide fine particle) 104 of the ferritin particles (protein complex) adsorbed on the surface. The treatment condition involves the temperature of 110° C. and a time period of 40 min. According to this treatment, the iron oxidize·hydroxide (ferrihydrite) core is believed to be altered to iron oxide ($Fe_2O_3$) through elimination of the moisture. A part of the cores can remain in the state of ferrihydrite, however, $Fe_2O_3$ and ferrihydrite merely differ in amount of the water composition. Because water is eliminated during the reduction treatment described later, either state is permitted which does not affect the following steps.

Figure 7:
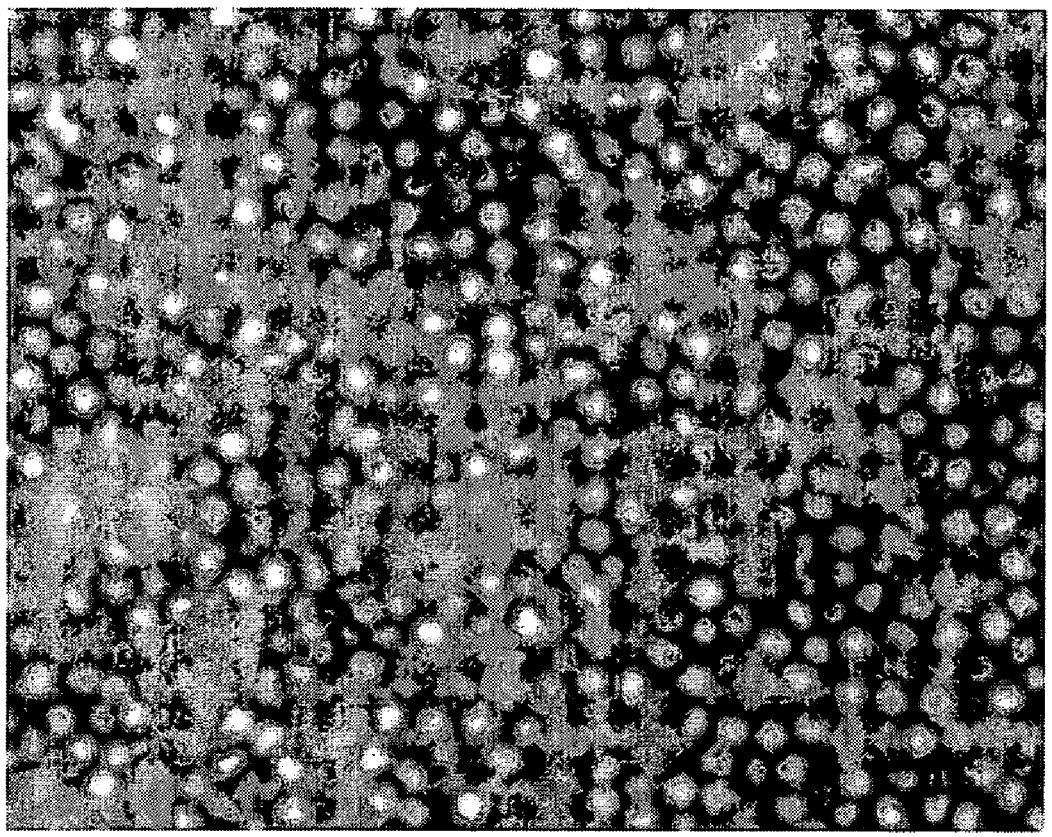
FIG. 7 is a scanning electron micrograph of a substrate surface according to Embodiment 2.

FIG. 7 shows an image obtained by observation of the surface of this substrate with a scanning electron microscope (SEM). Density of formation of the cores was $5.8 \times 10^{11}$ particles/cm$^2$, and neither aggregation nor deterioration of the shape of the core fine particles was found. Accordingly, retention of favorable state of dispersion could be verified.

In the method of forming a hollow protein with a basket-like shape having metal oxide cores (metal oxide fine particles) on a substrate, adsorption of ferritin was herein conducted on a cleaned $SiO_2$ surface, however, in addition thereto, adsorptive property can be also improved by previously subjecting the $SiO_2$ surface to an aminosilane treatment.

Furthermore, as a method of selectively removing the hollow protein to leave the metal oxide core (metal oxide fine particle) on the substrate, a UV ozone treatment was used herein, but in addition thereto, a heat treatment in nitrogen, a heat treatment in oxygen, an oxygen plasma treatment or the like may be also employed.

In this manner, deposition of a silicon nitride insulating layer 109 was carried out on a substrate with iron oxide that is a metal oxide (or, iron oxide·hydroxide) cores (metal oxide fine particle) produced thereon with a plasma CVD (chemical vapor deposition) process. In this step, a monosilane ($SiH_4$) gas and an ammonia gas were used as a source of plasma CVD, and deposition was executed at a substrate temperature of 300° C., with an RF power of 40 W for 45 sec. Consequently, a silicon nitride insulating layer 109 having a film thickness of 5 nm was formed.

Thereafter, the substrate on which the silicon nitride insulating layer 109 was deposited was subjected to a heat treatment in a reducing atmosphere of 10% hydrogen and 90% nitrogen at 400° C. for 1 hour. Accordingly, trivalent iron oxide cores (metal oxide fine particles) 104 embedded in the insulating layer 109 were reduced into $Fe_3O_4$ with bivalent and trivalent iron ion present admixed, and FeO that is a bivalent iron oxide or metal iron Fe. After the heat treatment, the temperature of the reducing atmosphere is lowered to 100° C. or less, and thereafter, the substrate was removed out to the ambient air.

Then, in order to evaluate alteration of state of the cores, an X-ray was irradiated from the upside face of the sample substrate before and after the reduction treatment to estimate the binding state of the core element by X-ray photoelectron spectroscopic (XPS) analysis. The substrate following the reduction treatment was exposed into the ambient air once and reserved, which was thereafter introduced to an XPS apparatus.

Figure 8A:
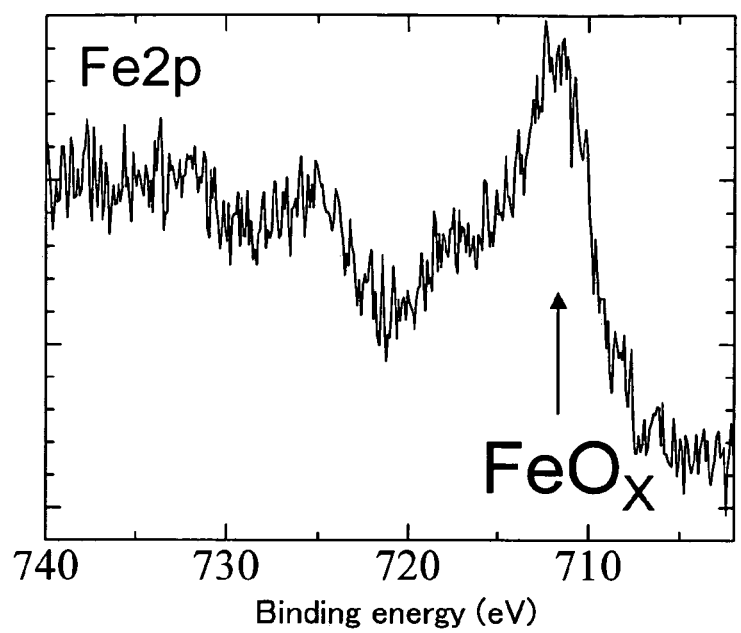
FIG. 8A and FIG. 8B are drawings illustrating results of measuring Fe2p spectrum with XPS of a substrate according to Embodiment 2.
Figure 8B:
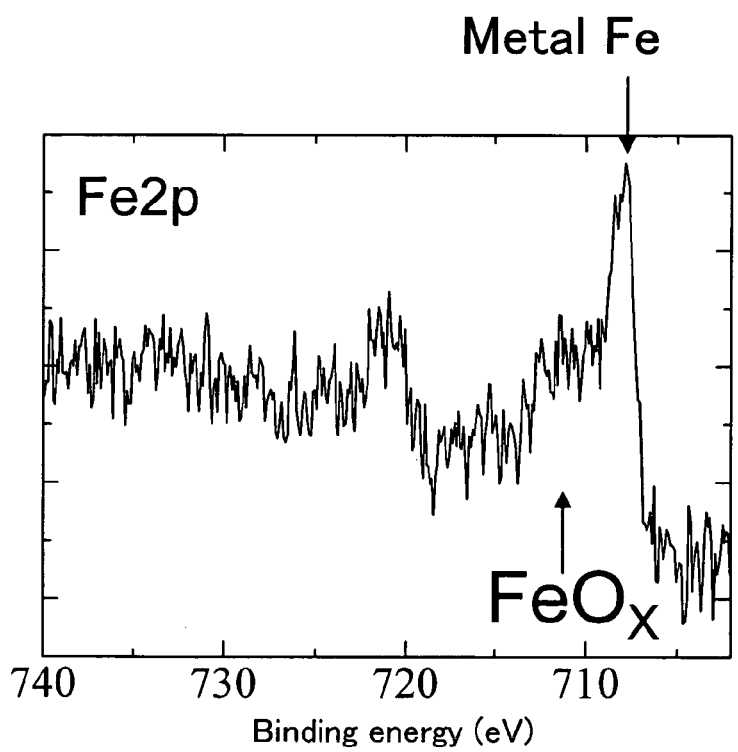

FIG. 8A and FIG. 8B show Fe2p spectrums obtained before the reduction treatment and after the reduction treatment, respectively. Binding state of iron can be determined from the position of Fe2p3/2 peak exhibiting the smallest binding energy in the Fe2p spectrum. Zerovalent metal iron, Fe, shows this peak around 707 eV; bivalent FeO crystal shows around 710 eV; trivalent $Fe_2O_3$ crystal shows around 711 eV; and trivalent FeO (OH) crystal shows around 711 to 712 eV. Chemical shift value of the compound may vary to some extent depending not only on the oxidation number but on surrounding ionic species and state of coordination. Although actual spectrum shall be broad compared to that of data on single crystals, any of the peak of iron oxide has been known to exhibit greater binding energy compared to metal iron.

Comparison of FIG. 8A and FIG. 8B reveal that peaks believed to result from iron oxide such as $Fe_2O_3$ and the like were dominant before the treatment, however, the reduction treatment caused significant decrease in peaks of iron oxide and appearance of a sharp peak instead resulting from zerovalent metal Fe.

From these facts, it is proven that the aforementioned step causes reduction of cores of iron oxide embedded in effect, and further, that the reduced core is retained stable even though the sample is exposed into the ambient air.

Although detailed mechanisms of the reduction are not clarified, the followings are suggested. Heating of the substrate sample accelerates diffusion of the molecules in the embedded insulating film, however, hydrogen molecules are penetrated into around the cores from outside to reduce the cores when hydrogen is included in the reducing atmosphere. Upon reduction of the cores, water molecules formed around the cores are eliminated outside through diffusion in the insulating film in the reverse direction. Oxygen within the core will diffuse in the insulator and move to the insulator surface when the reducing atmosphere does not include molecular species liable to be diffused such as hydrogen, which may lead to a possibility of elimination as water molecules through the reduction by the atmosphere. After completing the reduction treatment, diffusion velocity of the molecules in the insulating film is markedly decreased when the sample temperature is lowered. Hence, even after exposure into the ambient air, the oxygen molecules can not reach to around the cores inside, and thus the reduced cores will not be reoxidized and will be stably retained.

Embodiment 3

This Embodiment 3 illustrates one example of a semiconductor element in which silicon oxide is used as an insulator.

Figure 9:
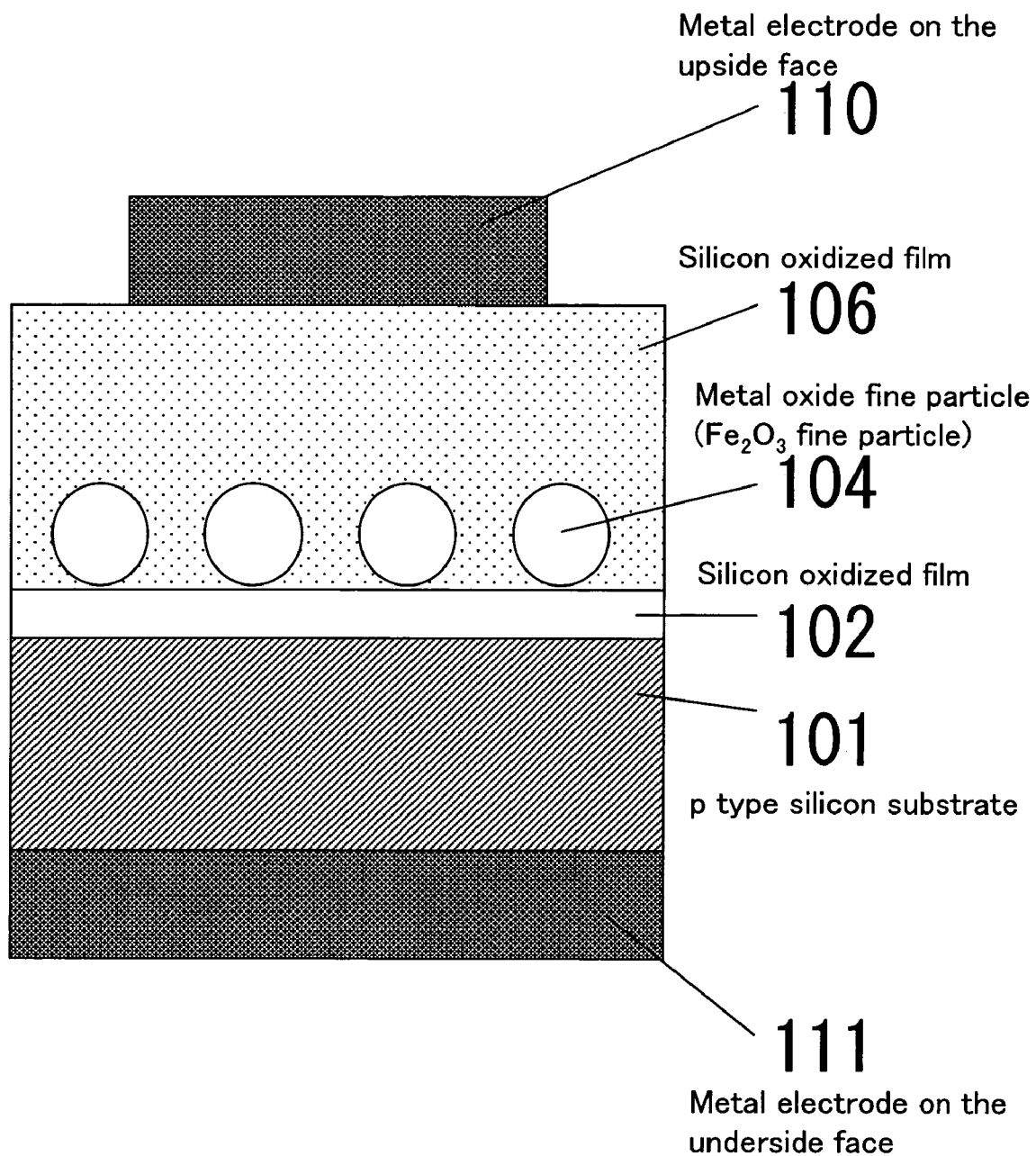
FIG. 9 is a cross sectional view illustrating a structure of a semiconductor element according to Embodiment 3.

Also in this Embodiment, a substrate having iron oxide cores embedded into an insulator was produced, and it was subjected to a reduction treatment, in a similar manner to Embodiment 2. However, silicon oxide ($SiO_2$) was used instead of silicon nitride as an insulating layer into which the cores are embedded. Cross sectional structural drawing of the semiconductor element of this Embodiment is shown in FIG. 9.

Onto a substrate having iron oxide cores produced according to similar steps of Embodiment 1 was deposited a $SiO_2$ insulating layer 106 by plasma CVD. In this step, deposition was carried out using a monosilane ($SiH_4$) gas and a nitrous oxide ($N_2O$) gas as sources of plasma CVD, and a nitrogen gas as a carrier, at a substrate temperature of 400° C., with RF power of 50 W for 60 sec. As a result, a $SiO_2$ insulating layer 106 having a film thickness of 20 nm was formed.

Thereafter, in order to evaluate the electric characteristics, aluminum electrodes (110 and 111) were formed on both upside and underside faces of the substrate by vacuum evaporation. The electrode 110 on the upside face is shaped to have a diameter of 100 μm. Further, the electrode 111 on the underside face was produced through carrying out metal vapor deposition after removing a naturally oxidized film with an aqueous hydrofluoric acid solution for the purpose of producing an ohmic electrode. Accordingly, a semiconductor element was manufactured.

Additionally, in a similar manner to Embodiment 2, this semiconductor element was subjected to a heat treatment in a reducing atmosphere of 10% hydrogen and 90% nitrogen at 400° C. for 1 hour. This treatment resulted in reduction of trivalent iron oxide cores (metal oxide fine particles) 104 embedded into the insulating layer 106 into FeO that is a bivalent iron oxide or metal iron Fe. After the heat treatment, the temperature of the reducing atmosphere was lowered to 100° C. or less, and thereafter, the substrate was recovered out to the ambient air. For comparison, a semiconductor element having a similar laminating insulator structure, but not having produced ferritin core (metal oxide fine particle) 104 was also produced.

Upon this procedure, in order to evaluate the formation of cores which can be utilized as an electronic device in effect, capacity-voltage (CV) characteristic of these semiconductor elements was measured. Specifically, the electrode on the underside face was grounded, and bias voltage was applied to the electrode on the upside face while applying alternating voltage of 1 MHz so as to superimpose thereto. Thus, electric capacity between both electrodes was estimated.

Figure 10A:
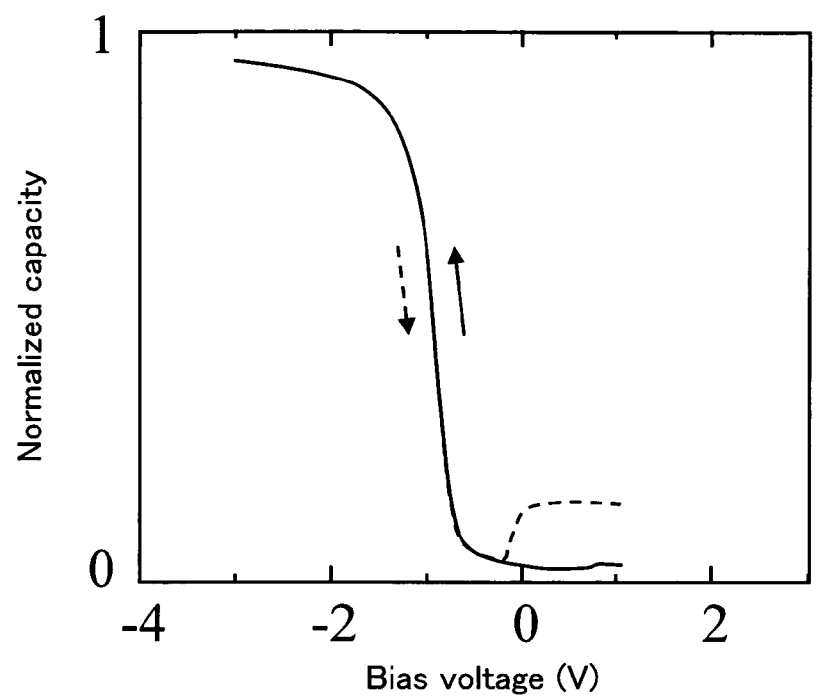
FIG. 10A and FIG. 10B are drawings illustrating results of measuring electric capacity between both electrodes of the semiconductor element according to Embodiment 3.
Figure 10B:
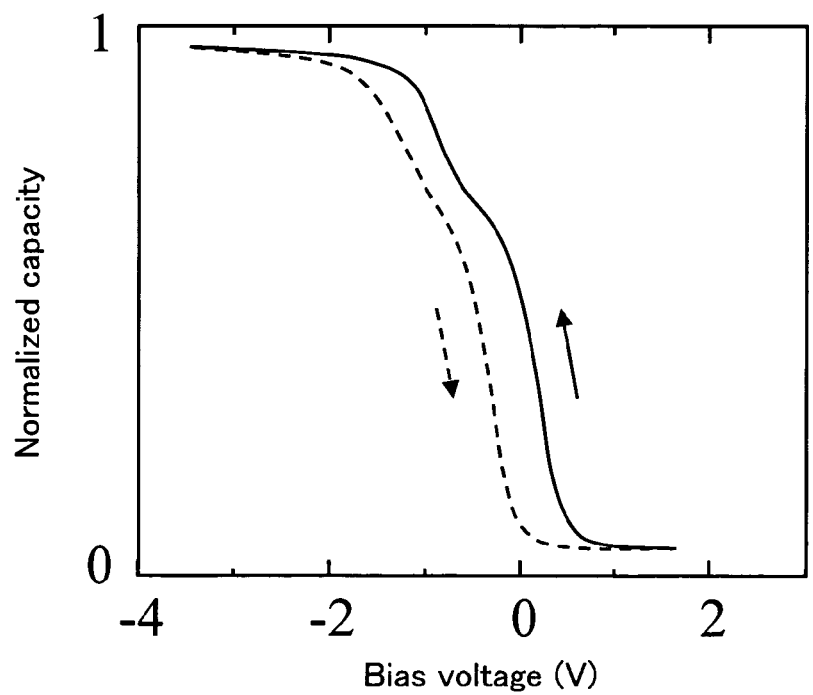

FIG. 10A and FIG. 10B show results of measurement on the semiconductor element not having cores formed, and on the semiconductor element having cores formed. In FIG. 10A and FIG. 10B, capacity characteristic exhibited upon sweeping the surface electrode voltage from lower voltage region to higher voltage region is shown in dotted line, while characteristic exhibited upon sweeping from higher voltage region to lower voltage region is shown in solid line. Each characteristic is normalized based on the capacity in the accumulated state (when depleted layer is absent). In FIG. 10A, hysteretic characteristic is not found at all, but distinct hysteretic characteristic was identified in FIG. 10B although influence of interface level is also found. This is believed to result from trap of the charge moved by a tunnel effect toward the core fine particles, which had been turned to be conductive or to be a semiconductor, from the semiconductor surface of the substrate upon applying bias voltage to the electrode on the upside face. Shift direction of the hysteretic characteristic corresponds to movement of the charge from upside face of the semiconductor toward the core fine particles (metal oxide fine particles), while amount of the shift corresponds to the state where approximately one electron is trapped per one core fine particle (metal oxide fine particle).

From the foregoing results, it is revealed that the core fine particles (metal oxide fine particles) are reduced from trivalent $Fe_2O_3$ which is an insulator into $Fe_3O_4$ or FeO which is a semiconductor and is in the low oxidized state, or zerovalent metal Fe, and that those fine particles function as a carrier for retaining the charge which traps the charge through charging/discharging within the semiconductor apparatus.

Additionally, production of the structure as shown in FIG. 9 in the FET gate region achieves a memory element that records the information by means of charge quantity of the core fine particles (metal oxide fine particles).

In terms of inhibition of reoxidation through keeping the reduced state of the embedded cores, to construct a structure in which en electrode made of a metal or amorphous silicon is formed on the upper region where the cores were embedded as the metal electrode 110 on the upside face shown in FIG. 9 is desired because invasion of oxygen and the like in the ambient air can be blocked.

Embodiment 4

In Embodiment 4, one example of the method of forming a fine particle array on a substrate will be illustrated, accompanied by explanation of reducing action by the carbon atoms remaining around the fine particles.

First, a substrate surface having a silicon oxidized film was subjected to an aminosilane treatment to adsorb and fix recombinant ferritin (Fer4) having iron oxide (ferrihydrite) core (metal oxide fine particle), in a similar manner to Embodiment 1. In this Embodiment, the silicon oxidized film as a base had a film thickness of 3 nm.

Next, the substrate having a protein complex (ferritin) adsorbed and fixed thereon was subjected to a heat treatment thereby removing surrounding hollow protein parts. Using a rapid thermal annealing furnace (RTA furnace), a heat treatment in an oxygen atmosphere was carried out for 10 min. In this procedure, two types of substrates were produced at the temperature of the heat treatment of 500° C. and 400° C., respectively. According to this heat treatment, ferrihydrite core is supposed to be converted into $Fe_2O_3$.

When the surface composition was evaluated by the XPS analysis, spectra of carbon and nitrogen resulting from the hollow protein were observed on the substrate produced without subjecting to the heat treatment. Any spectrum of nitrogen was not observed from either one of the substrate surface after subjecting to the heat treatment. Although the substrate subjected to the heat treatment at 500° C. exhibited the carbon spectrum below the level of surface contamination, to the contrary, the substrate subjected to the heat treatment at 400°

C. was ascertained to include remaining carbon atoms of about 7% converted on the basis of the surface atom concentration. This finding suggests that the heat treatment at 500° C. almost completely removes the carbon resulting from the hollow protein, while the heat treatment at 400° C. leaves a part of the carbon remaining around the ferritin cores.

In order to evaluate the reducibility of the core fine particles, reduction by ion sputtering on these two types of substrates was attempted inside of the XPS apparatus to determine the Fe2p spectrum. The ion sputtering was carried out under a vacuum atmosphere by irradiating argon ion ($Ar^+$) accelerated with the acceleration voltage of 3 kV for 15 sec on the substrate surface.

Figure 11A:
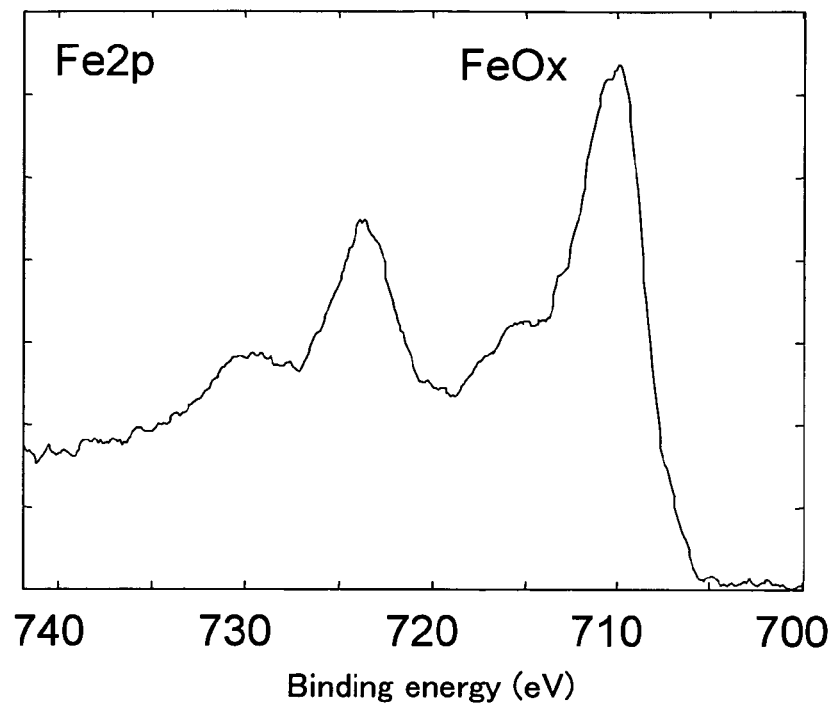
FIG. 11A and FIG. 11B are drawings illustrating results of measuring Fe2p spectrum with XPS of a substrate according to Embodiment 4.
Figure 11B:
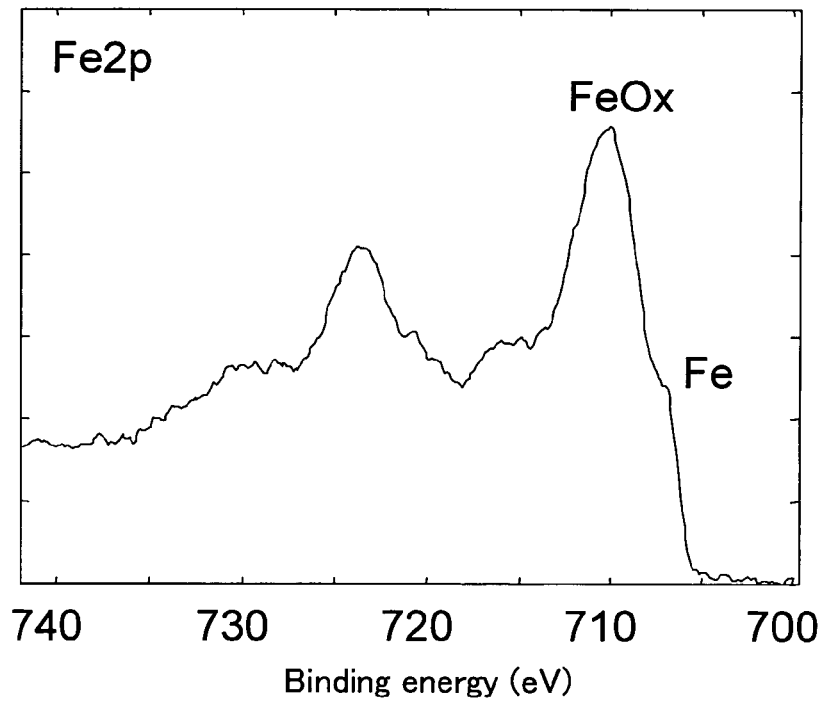

FIG. 11A and FIG. 11B show the results of evaluation after sputtering of the substrate subjected to the heat treatment at 500° C. and 400° C., respectively. Contrary to the substrate subjected to the heat treatment at 500° C. exhibiting only a peak of iron oxide, the substrate subjected to the heat treatment at 400° C. explicitly exhibited the peak of zerovalent metal Fe showing low binding energy, at the shoulder of the iron oxide peak. From these results, it was indicated that reduction of the core fine particles (metal oxide fine particles) may be accelerated by leaving a part of the carbon, which results from the hollow protein, around the cores in removal of the outer shell hollow protein.

Conditions of eliminating the hollow protein may preferably involve, for example, the heat treatment in an oxygen atmosphere at a temperature of 300° C. or higher and 450° C. or lower, or the heat treatment in a nitrogen atmosphere at a temperature of 300° C. or higher and 600° C. or lower. Accordingly, the hollow protein can be removed while leaving a part of the carbon.

In addition, also by an oxidation treatment to expose to oxygen plasma at room temperature, it is possible to leave the carbon atoms around the metal oxide fine particles after removing the hollow protein.

[Thermodynamic Relationship Between Insulating Layer and Core]

Hereinafter, thermodynamic relationship between the insulating layer and metal oxide fine particle (core) included in the hollow protein complex will be explained.

Figure 12:
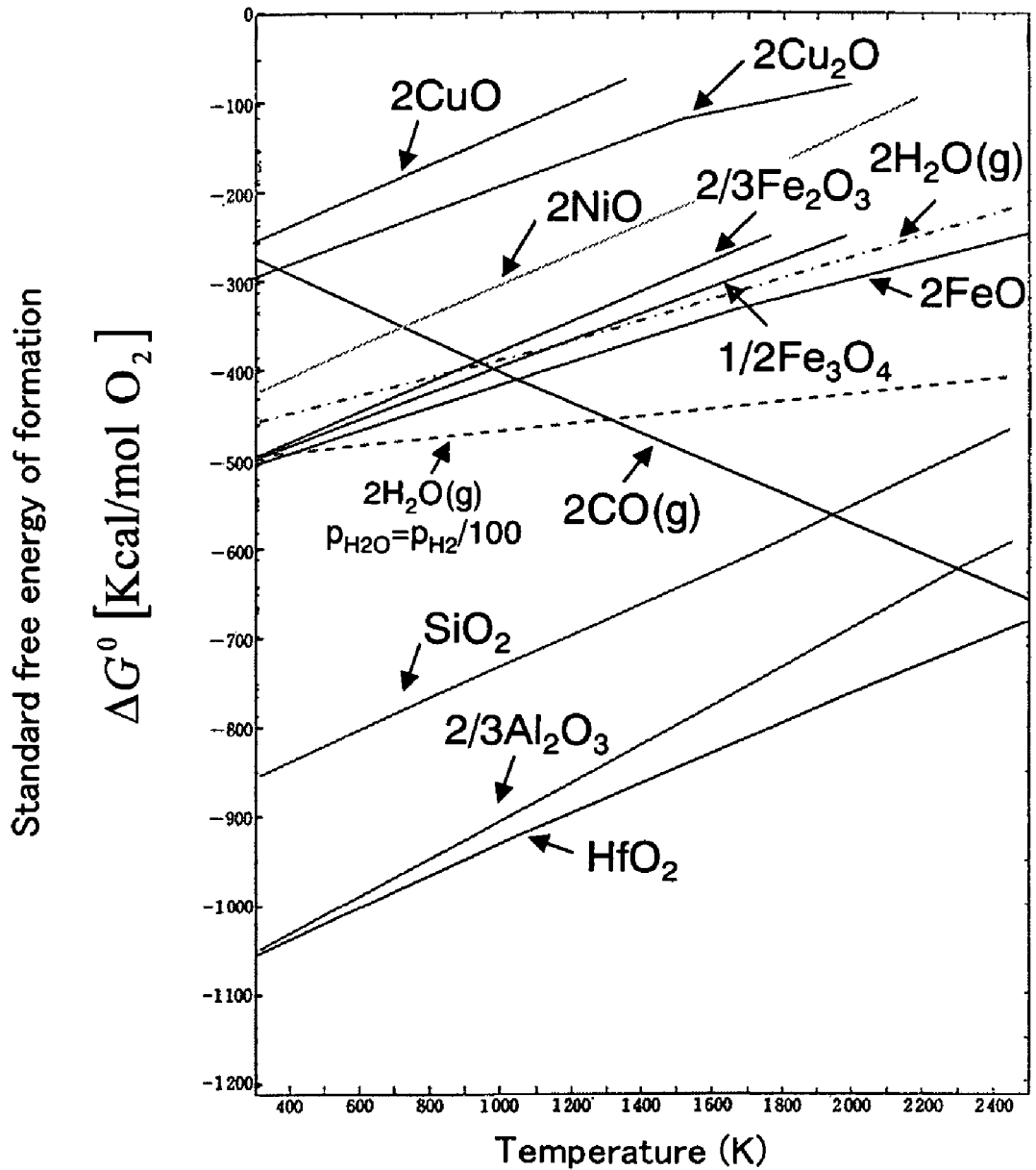
FIG. 12 is a drawing illustrating a relationship between the temperature and the standard free energy of formation upon production of each oxide from the metal state through binding to one molecule of oxygen.

FIG. 12 shows a relation ship between the temperature and standard free energy of formation upon production of each type of oxide from the metal state through binding to one oxygen molecule. According to the present invention, the standard free energy of formation of many metal oxide cores (metal oxide fine particles) being greater compared to that of the insulating layer, in other words, the property liable to be reduced is utilized. For example, when $SiO_2$, $Al_2O_3$ or $HfO_2$ is used as an insulating layer into which the cores are embedded, while a metal oxide of iron, nickel or copper is used as a core, the core fine particle (metal oxide fine particle) will have greater standard free energy of formation in any temperature region compared to the insulating layer. Therefore, it is revealed that these oxide cores can be reduced into the metal as a single element without reducing the embedded insulator.

Also, the followings are proven as requirements for reducing conditions. For example, a dashed line in FIG. 12 shows standard free energy of formation of water molecules in case where every partial pressure of hydrogen and water vapor is 1 atm. The metal oxide positioned in the graph above the dashed line can be reduced into the metal under this condition. In addition, it is still easier to reduce oxide into the oxidized state having a lower oxidation number (for example, from $Fe_2O_3$ into $Fe_3O_4$) than to reduce the oxide into the metal of a single element state.

Furthermore, under the actual heat treatment conditions, partial pressure of the water vapor is very low, but for example, still more metal can be reduced by merely making the partial pressure of water vapor not higher than $1/100$ of the hydrogen partial pressure, because the standard free energy of formation of water molecules is lowered to the dashed line level. Similarly, standard free energy of formation of CO can be also lowered below the line level of 2CO (g) in FIG. 12 by decreasing partial pressure of carbon monoxide, therefore, large quantity of the metal can be reduced even though carbon is used.

Selective reduction of oxide cores according to the present invention is based on the aforementioned thermodynamic relationship. Therefore, it is preferred that the insulating layer and the oxide cores in the present invention comply with the correlation of: standard free energy of formation of insulating layer into which the cores are embedded per one molecule of oxygen being lower than that of the oxide cores.

For example, the core oxide desirably has the standard free energy of formation of not lower than −500 Kcal/mol $O_2$ at 300° C. (573 K) or higher because reduction to the metal state can be readily carried out under the aforementioned condition (partial pressure of water vapor being $1/100$ or less of partial pressure of hydrogen). Examples of such material which can be readily reduced include, for example, oxides of iron, nickel and copper. When reduction to the metal state is not required, but the function may be fulfilled by merely decreasing the oxidation number, the present invention can be applied to even more wide range of metal oxides.

As the insulating layer into which the cores are embedded, an oxide having the standard free energy of formation of not higher than −600 Kcal/mol $O_2$ at 800° C. (1073 K) or lower can be utilized. Hence, difference in oxidizing force of at least 100 Kcal/mol $O_2$ or greater can be secured even in a heat treatment under the aforementioned reducing atmosphere. Therefore, loss of insulation properties through reduction of the insulating layer per se, or disruption of the element structure will be avoided. Examples of such material that is resistant to reduction which may be used include e.g., oxides of silicon, aluminum and hafnium (silicon oxide, aluminum oxide and hafnium oxide). In addition, except for the oxides, examples of stable material which may be also used that is similarly resistant to reduction include nitrides and oxynitrides of the metal constituting the aforementioned oxide, for example, silicon nitride, silicon oxynitride and the like.

Also with respect to the insulating layer to be a base for forming the fine particles, any material as described above may be used similarly to the insulating layer into which the cores are embedded, on the same grounds.

Embodiment 5

Next, one example of the semiconductor element of the present invention will be illustrated as Embodiment 5. Hereinafter, this Embodiment will be explained with reference to FIG. 13.

Figure 13:
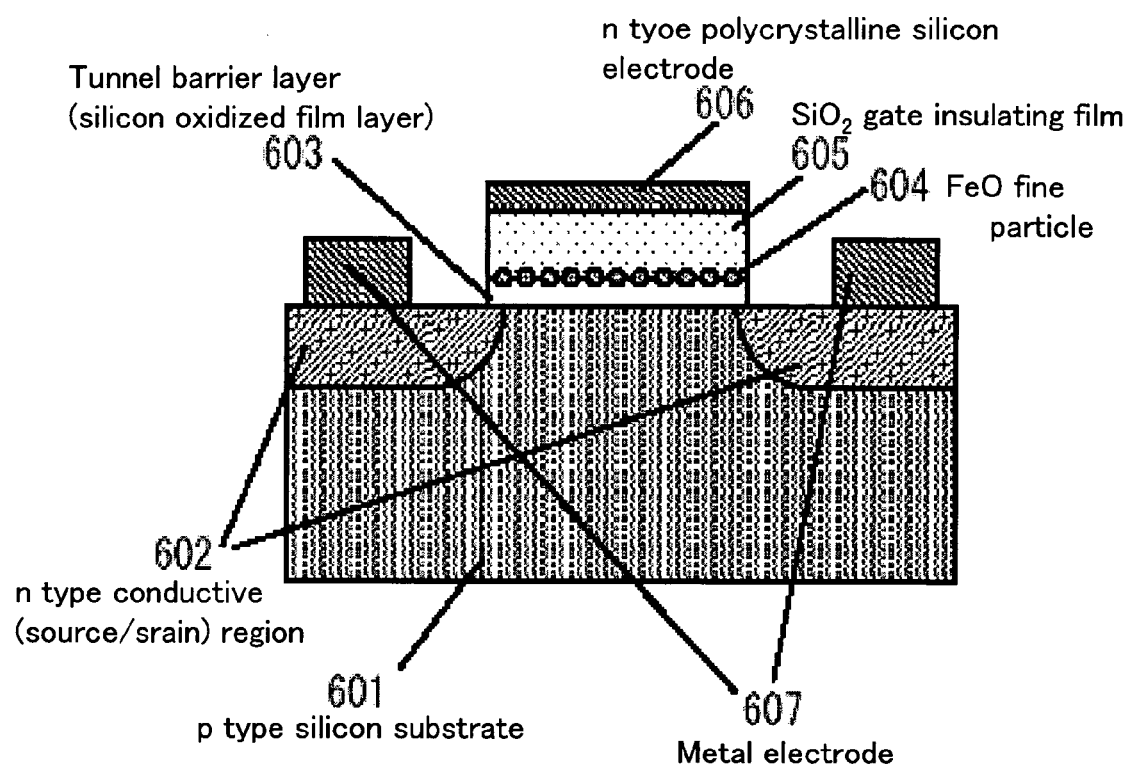
FIG. 13 is a cross sectional view illustrating a structure of a semiconductor element according to Embodiment 5.

As shown in the cross sectional structural view in FIG. 13, the semiconductor element of this Embodiment has an n type conductive region 602, which functions as a source region or a drain region, in a p type silicon substrate 601 as a semiconductor substrate, thereby forming an MIS type transistor structure together with a metal electrode 607 as a source or drain electrode, an $SiO_2$ gate insulating layer 605 (second insulating layer) as a gate insulating film, and an n type polycrystalline silicon layer 606 as a gate electrode. Also, a silicon oxidized film layer 603 (first insulating layer) as a barrier layer that functions as a tunnel barrier layer mounted on the semiconductor substrate, and FeO fine particles 604 (metal or semiconductor fine particles) formed on the tunnel barrier layer 603 are provided between the gate insulating film 605 and the semiconductor substrate 601 of the aforementioned MIS transistor structure.

The FeO fine particles 604 of this Embodiment were obtained by reducing $Fe_2O_3$ according to the method demonstrated in Embodiment 1. The FeO fine particles 604 function as semiconductor fine particles embedded into the insulating layer ($SiO_2$) because of the small band gap.

FeO fine particle 604 has an in-plane density of approximately $3 \times 10^{11}$ particles/$cm^2$ with a uniform state of in-plane dispersion. Thus, contact among the fine particles can be suppressed.

According to this Embodiment, the FeO fine particle 604 formed in the gate region of the MIS transistor structure functions as a charge retaining dot, thereby altering a threshold voltage of the MIS transistor characteristic between the state in which the fine particle retains charge therein and the state in which it retains no charge therein. Accordingly, it operates as a nonvolatile semiconductor memory element.

Although FeO fine particles were used as the fine particle in this Embodiment, semiconductors and other metal materials can be used, similarly.

Although a p type silicon substrate was used as a semiconductor substrate in this Embodiment, in addition thereto, any substrate in which a semiconductor material is used such as an n type silicon substrate, a GaAs substrate or the like, can be also used according to the present invention.

Although $SiO_2$ was used as the insulating layer in this Embodiment, other insulator material such as silicon nitride, silicon oxynitride, $Al_2O_3$, $HfO_2$ or the like can be also used. In addition, various modifications can be made within the scope without departing from the aspect of the present invention.

The semiconductor element of this Embodiment is advantageous in that reoxidization of the reduced fine particles is suppressed and characteristics of the semiconductor element are stabilized because reduction of the fine particles 604 was carried out after forming the second insulating layer 605.

From the foregoing descriptions, many modifications and other embodiments of the present invention will be apparent to persons skilled in the art. Therefore, the foregoing descriptions should be construed as just for illustrative exemplification, provided for the purpose of teaching the best embodiment for carrying out the present invention to persons skilled in the art. Details of construction and/or function of the present invention can be substantially altered without departing from the spirit thereof.

The method of forming fine particles according to the present invention is useful as a method of forming fine particles or fine particle groups on various types of substrates. Particularly, the method can be applied to methods of manufacturing semiconductor elements and the like in which fine particles are used.

Furthermore, the semiconductor element according to the present invention is useful as electronic devices and the like having an insulating layer with high quality without involving defect up to comparatively high temperature.

What is claimed is:

1. A method of forming a fine particle array on a substrate which comprises:
   a step A of fixing metal oxide fine particles and protein complexes comprising a hollow protein, which includes said metal oxide fine particle therein, on said substrate,
   a step B of removing said hollow protein while leaving said metal oxide fine particles on said substrate after said step A,
   a step C of covering said metal oxide fine particles by depositing an insulating layer having a film thickness of 3 nm or greater and 100 nm or less, which is hardly reduced compared to said metal oxide fine particles, on said substrate on which said metal oxide fine particles were disposed, and
   a step D of reducing said metal oxide fine particles covered by said insulating layer by subjecting the substrate, on which the insulating layer was deposited in said step C, to a heat treatment in a reducing atmosphere.

2. The method of forming a fine particle array on a substrate according to claim 1 wherein a part of the carbon atoms constituting said protein complex are left around said metal oxide fine particles in said step B.

3. The method of forming a fine particle array on a substrate according to claim 1 wherein the fine particle formed by the reduction in said step D is an oxide semiconductor fine particle having a lower oxidation number compared to said metal oxide fine particle.

* * * * *